US009958476B2

United States Patent
Eldridge

(10) Patent No.: US 9,958,476 B2
(45) Date of Patent: May 1, 2018

(54) FLOATING NEST FOR A TEST SOCKET

(71) Applicant: FormFactor, Inc., Livermore, CA (US)

(72) Inventor: Benjamin N. Eldridge, Danville, CA (US)

(73) Assignee: FormFactor, Inc., Livermore, CA (US)

( * ) Notice: Subject to any disclaimer, the term of this patent is extended or adjusted under 35 U.S.C. 154(b) by 0 days. days.

(21) Appl. No.: 15/359,245

(22) Filed: Nov. 22, 2016

(65) Prior Publication Data

US 2017/0146566 A1    May 25, 2017

Related U.S. Application Data

(60) Provisional application No. 62/260,124, filed on Nov. 25, 2015.

(51) Int. Cl.
*G01R 31/20* (2006.01)
*G01R 1/04* (2006.01)

(52) U.S. Cl.
CPC .................. *G01R 1/0441* (2013.01)

(58) Field of Classification Search
CPC ............. G01R 1/0466; G01R 31/2601; G01R 31/2875; G01R 1/0433; G01R 31/025; G01R 31/2851; G01R 31/2856; G01R 1/07314; G01R 1/07378
USPC ..... 324/756.02, 750.15, 755, 759, 763, 762, 324/750.01, 750.18, 750.03, 755.01, 324/756.03, 757.04, 762.02; 606/41, 1, 606/49
See application file for complete search history.

(56) References Cited

U.S. PATENT DOCUMENTS

| 5,123,850 | A | | 6/1992 | Elder et al. |
| 5,204,616 | A | * | 4/1993 | Buchanan ................ G01R 1/04 324/750.25 |
| 5,342,206 | A | | 8/1994 | Grabbe et al. |
| 5,534,787 | A | * | 7/1996 | Levy .................. G01R 1/06772 324/754.09 |
| 5,594,355 | A | * | 1/1997 | Ludwig ................ H05K 7/1023 324/750.25 |
| 5,788,526 | A | | 8/1998 | Twigg et al. |
| 5,844,418 | A | * | 12/1998 | Wood ....................... B25G 3/28 257/E21.509 |
| 6,033,935 | A | | 3/2000 | Dozier, II et al. |
| 6,242,933 | B1 | | 6/2001 | Yap |
| 6,330,744 | B1 | * | 12/2001 | Doherty ............. G01R 1/07314 29/592.1 |
| 6,437,586 | B1 | * | 8/2002 | Robinson ............. G01R 1/0433 324/756.02 |
| 6,707,311 | B2 | | 3/2004 | Hohenwarter |
| 6,859,054 | B1 | | 2/2005 | Zhou et al. |

(Continued)

*Primary Examiner* — Jermele M Hollington
*Assistant Examiner* — Taqi Nasir
(74) *Attorney, Agent, or Firm* — Lumen Patent Firm

(57) ABSTRACT

A test socket for facilitating testing of a device under test (DUT) includes a holder comprising a mounting structure for attaching the holder to other components of the socket and a floating nest structure in which the DUT can be disposed. The floating nest structure can have a seat cavity sized and shaped to receive and hold the DUT such that at least some of the DUT terminals are in contact with corresponding contacts of a test board while the test socket is attached to the test board. A flexure located laterally between the mounting structure and the floating nest structure and can allow the nest structure to move relative to the mounting structure and thus float.

23 Claims, 15 Drawing Sheets

(56) References Cited

U.S. PATENT DOCUMENTS

| | | |
|---|---|---|
| 7,202,677 B2 | 4/2007 | Pedersen et al. |
| 7,307,426 B2* | 12/2007 | Parker .................. G01R 31/312 |
| | | 324/509 |
| 7,358,753 B2* | 4/2008 | Tang ................... G01R 31/2808 |
| | | 324/537 |
| 2001/0035763 A1* | 11/2001 | Mess ................... H01L 21/4853 |
| | | 324/756.02 |
| 2004/0080329 A1 | 4/2004 | Jain |
| 2005/0225315 A1* | 10/2005 | Goldsmith ........... G01R 1/0433 |
| | | 324/756.02 |
| 2009/0184728 A1* | 7/2009 | Nakamura ............ B81B 3/0005 |
| | | 324/755.01 |
| 2010/0231251 A1 | 9/2010 | Nelson et al. |
| 2012/0019275 A1* | 1/2012 | Dehmel ............. G01R 1/07328 |
| | | 324/754.11 |
| 2012/0119769 A1* | 5/2012 | Dehkordi ............. G01R 31/281 |
| | | 324/750.03 |
| 2014/0327462 A1 | 11/2014 | Jeong et al. |
| 2015/0369840 A1 | 12/2015 | Treibergs et al. |

* cited by examiner

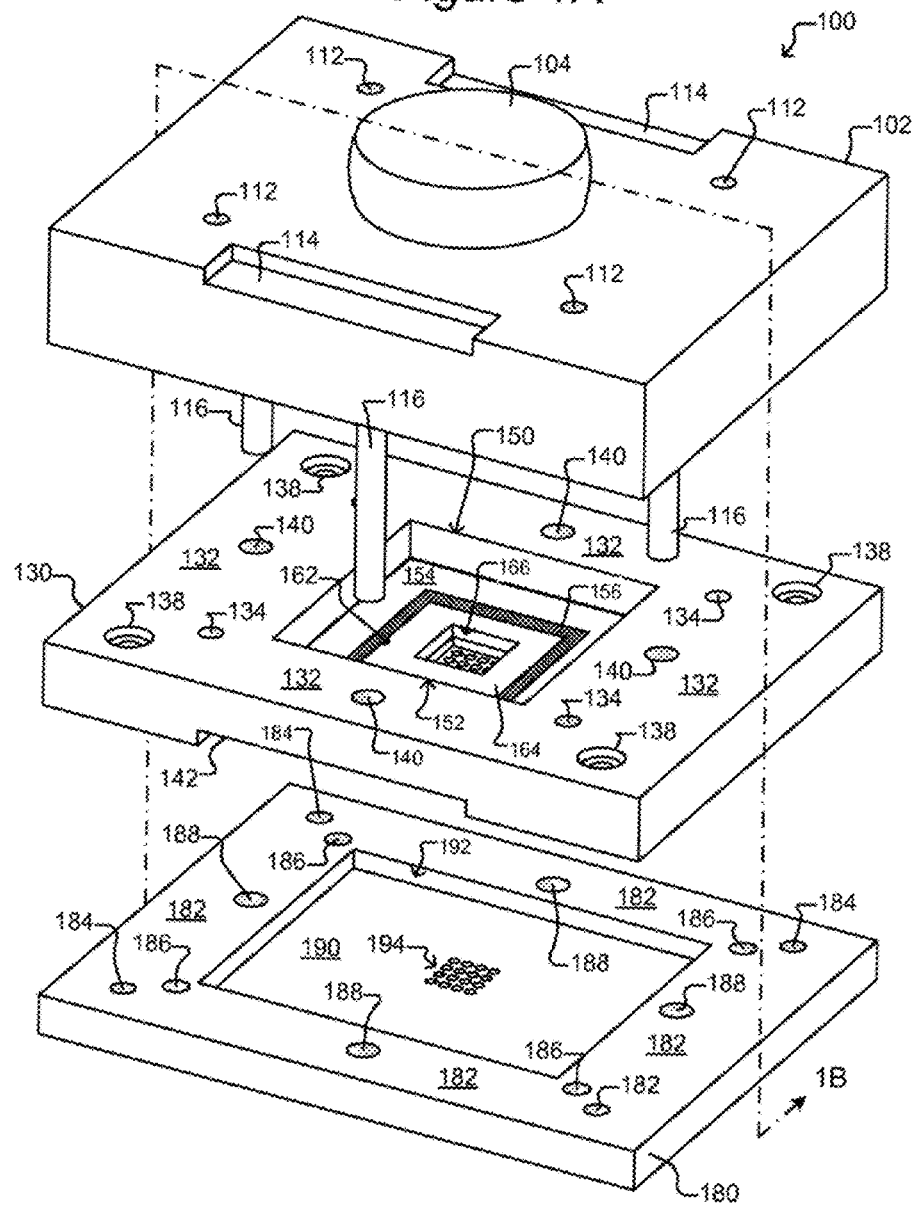

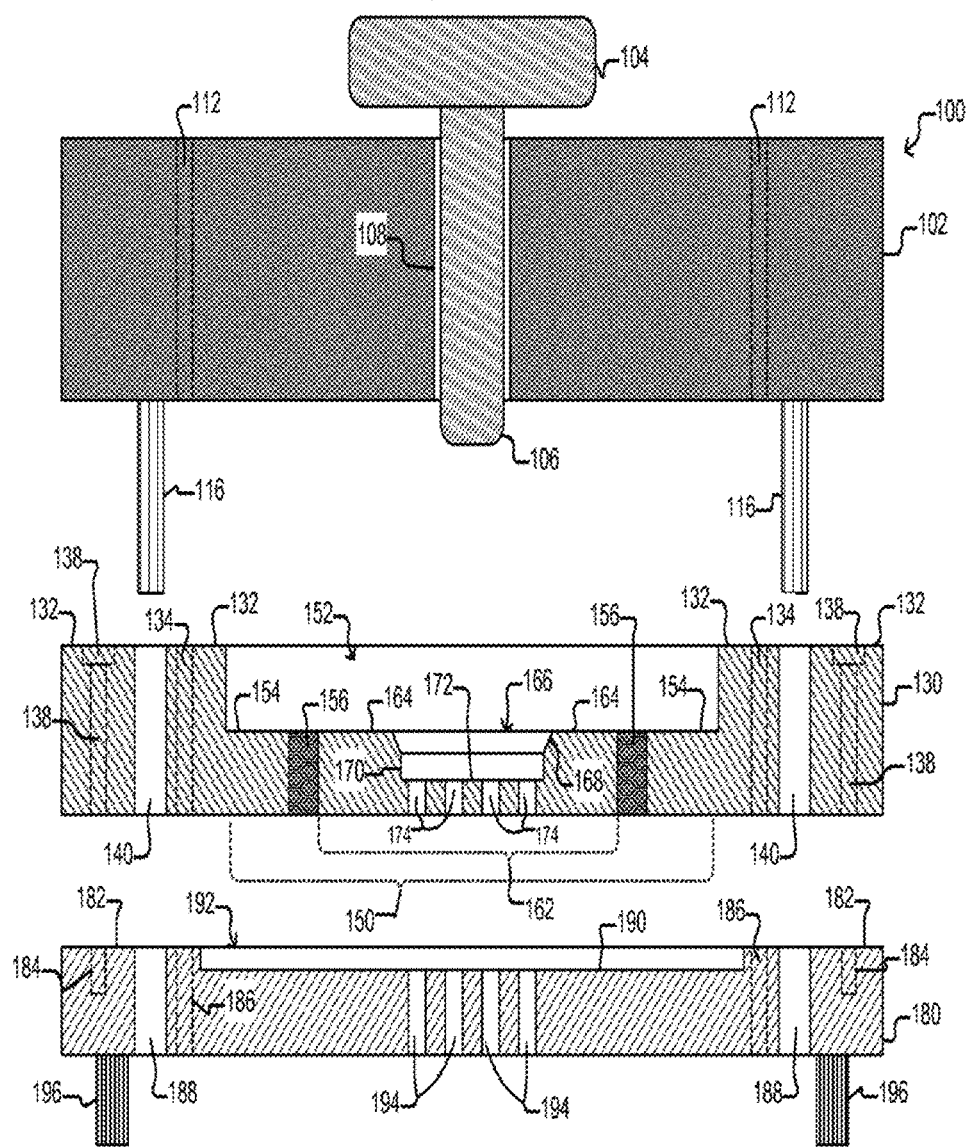

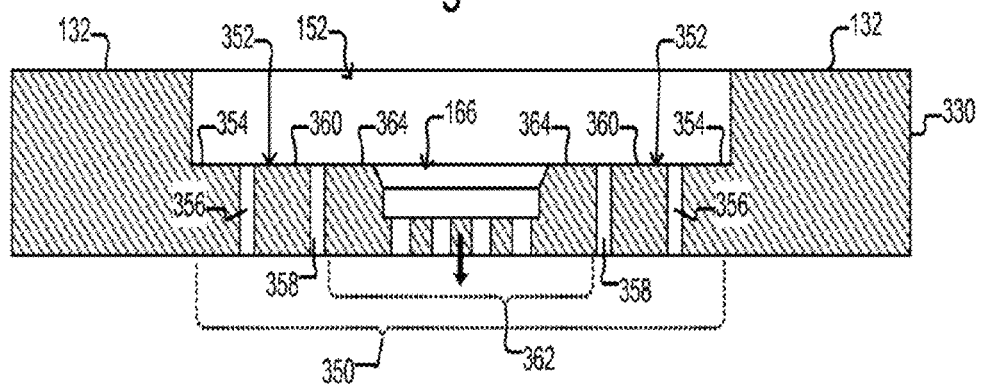
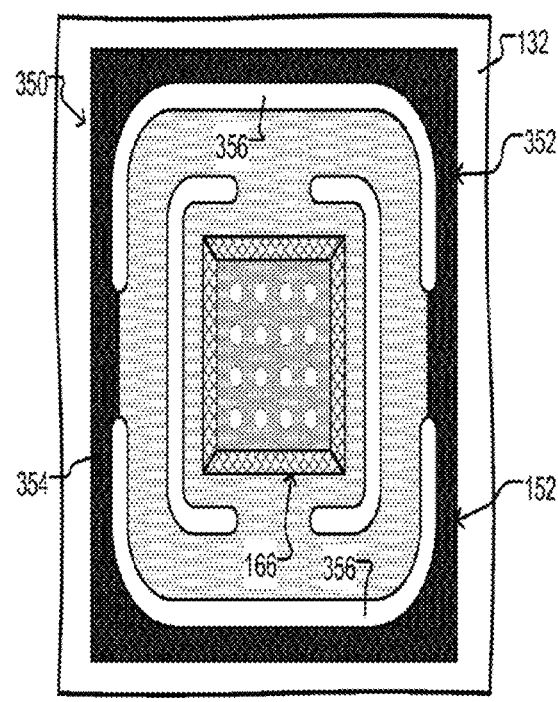

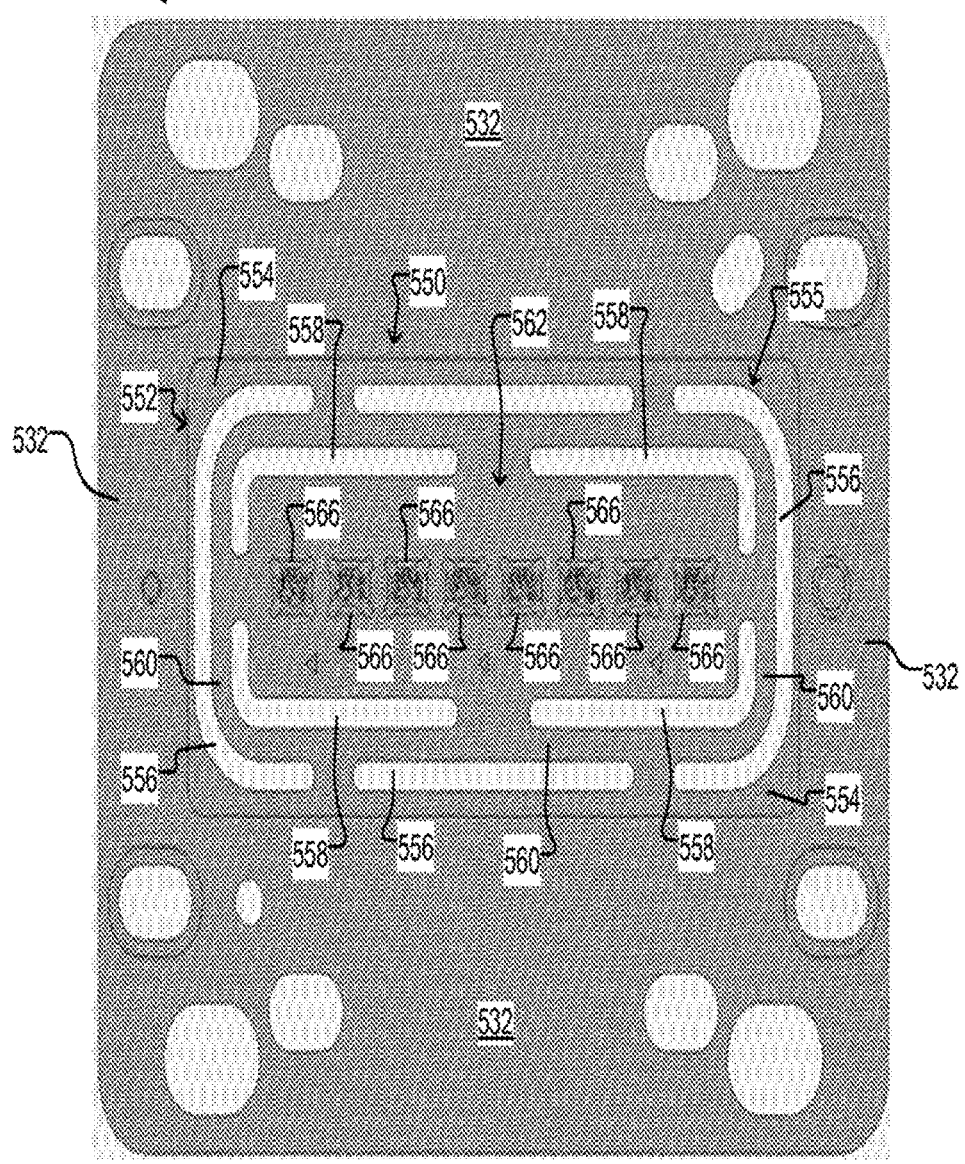

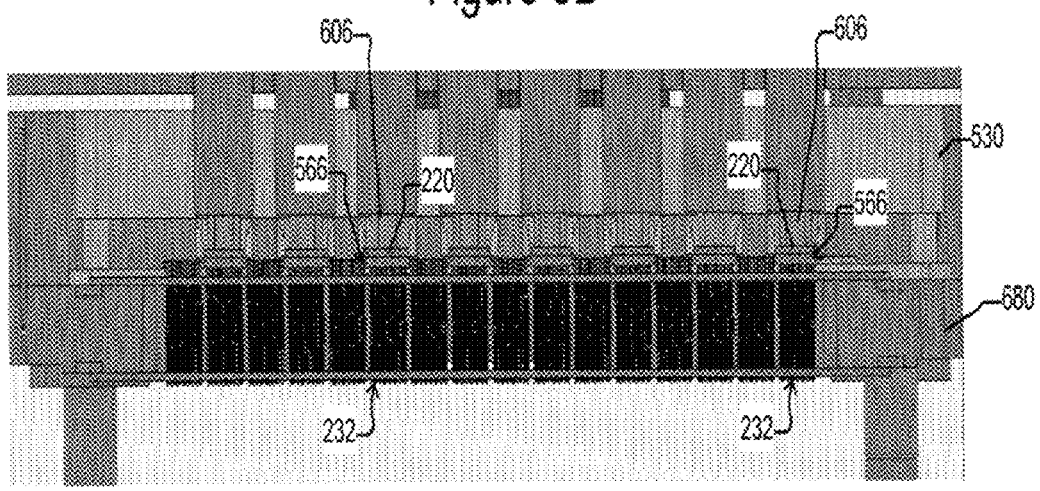

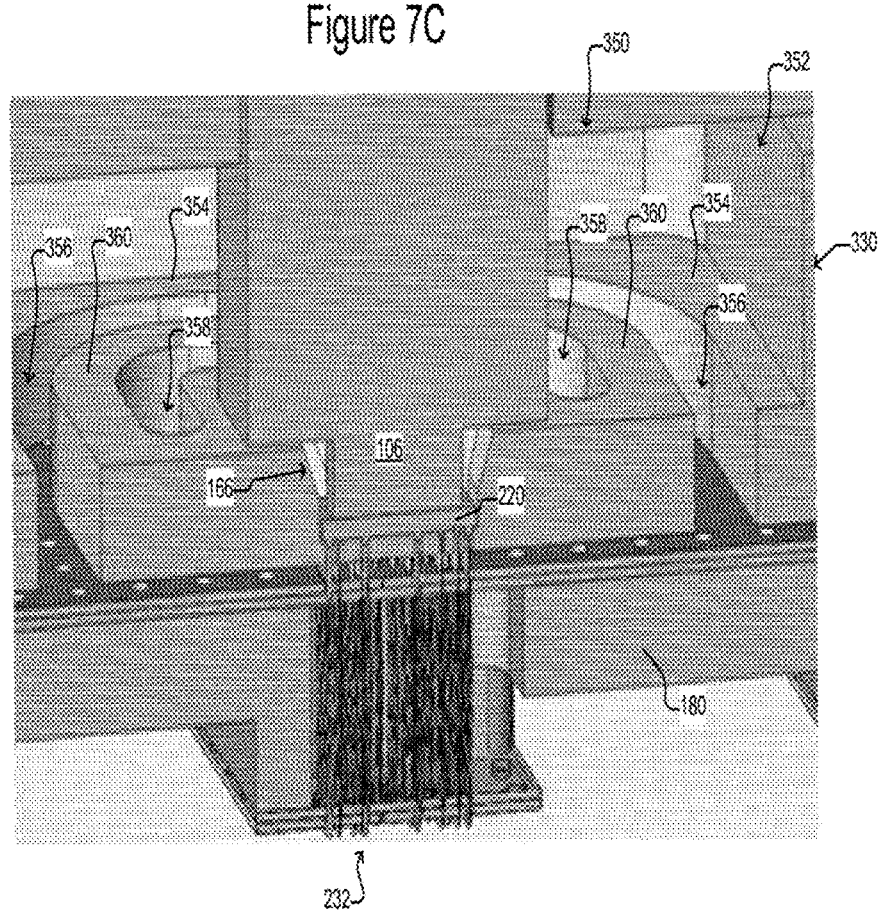

FLOATING NEST FOR A TEST SOCKET

CROSS REFERENCE TO RELATED APPLICATIONS

This application claims the benefit of U.S. provisional patent application 62/260,124, filed on Nov. 25, 2015, and hereby incorporated by reference in its entirety.

BACKGROUND

Embodiments of the present invention are directed to improvements in test sockets such as are utilized to hold and test a device under test (DUT). Some embodiments are particularly directed to improvements in nest structures for holding one or more DUTs in such test sockets.

SUMMARY

In some embodiments, a test socket can include, among other elements, a holder, which can comprises a mounting structure, a floating nest, and a flexure. The test socket can be configured hold a DUT and to be readily attached to and detached from a test board comprising pins for contacting input and/or output terminals of the DUT. The mounting structure of the test socket can include attachment features by which the socket can be attached to and detached from the test board. The floating nest can have a seat cavity sized and shaped to receive and hold the DUT such that at least some of the DUT terminals are in contact with corresponding pins of the test board while the test socket is attached to the test board. The flexure can be located laterally between the mounting structure and the floating nest and can allow the floating nest to move relative to the mounting structure. The floating nest allows for the DUT to be brought into compression with the pins after alignment of the DUT to the pins has taken place.

BRIEF DESCRIPTION OF THE DRAWINGS

FIG. 1A is an exploded perspective view of elements of a test socket for holding a DUT according to some embodiments of the invention.

FIG. 1B is a side, cross-sectional view of the test socket of FIG. 1A.

FIG. 3A is a top view and FIG. 3B is a side, cross-sectional view of an example configuration of the holder of the test socket of FIG. 1A according to some embodiments of the invention.

FIGS. 4A, 4B, and 4C show top partial views of the holder of FIGS. 3A and 3B highlighting, respectively, an outer region, an intermediate region, and an inner region of a nested holding structure of the holder.

FIG. 5 is a top view of an example of a holder having a floating multi-nest structure for holding multiple DUTs according to some embodiments of the invention.

FIGS. 6A and 6B show an example of a test socket of which the holder of FIG. 5 is a component according to some embodiments of the invention.

FIGS. 7A-7D illustrate an example configuration of the test socket of FIGS. 1A and 1B comprising the holder of FIGS. 3A and 3B according to some embodiments of the invention.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the figures may show simplified or partial views, and the dimensions of elements in the figures may be exaggerated or otherwise not in proportion. In addition, as the terms "on," "attached to," "connected to," "coupled to," or similar words are used herein, one element (e.g., a material, a layer, a substrate, etc.) can be "on," "attached to," "connected to," or "coupled to" another element regardless of whether the one element is directly on, attached to, connected to, or coupled to the other element or there are one or more intervening elements between the one element and the other element. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

As used herein, "substantially" means sufficient to work for the intended purpose. The term "substantially" thus allows for minor, insignificant variations from an absolute or perfect state, dimension, measurement, result, or the like such as would be expected by a person of ordinary skill in the field but that do not appreciably affect overall performance. When used with respect to numerical values or parameters or characteristics that can be expressed as numerical values, "substantially" means within ten percent. The term "ones" means more than one. The term "disposed" encompasses within its meaning "placed" and/or "located."

The term "DUT" is an acronym for "device under test" and, as used herein, refers to a device (e.g., an electronic device such as a semiconductor die whether packaged or unpackaged) that is undergoing testing or is to be subjected to testing.

Figure 2A:
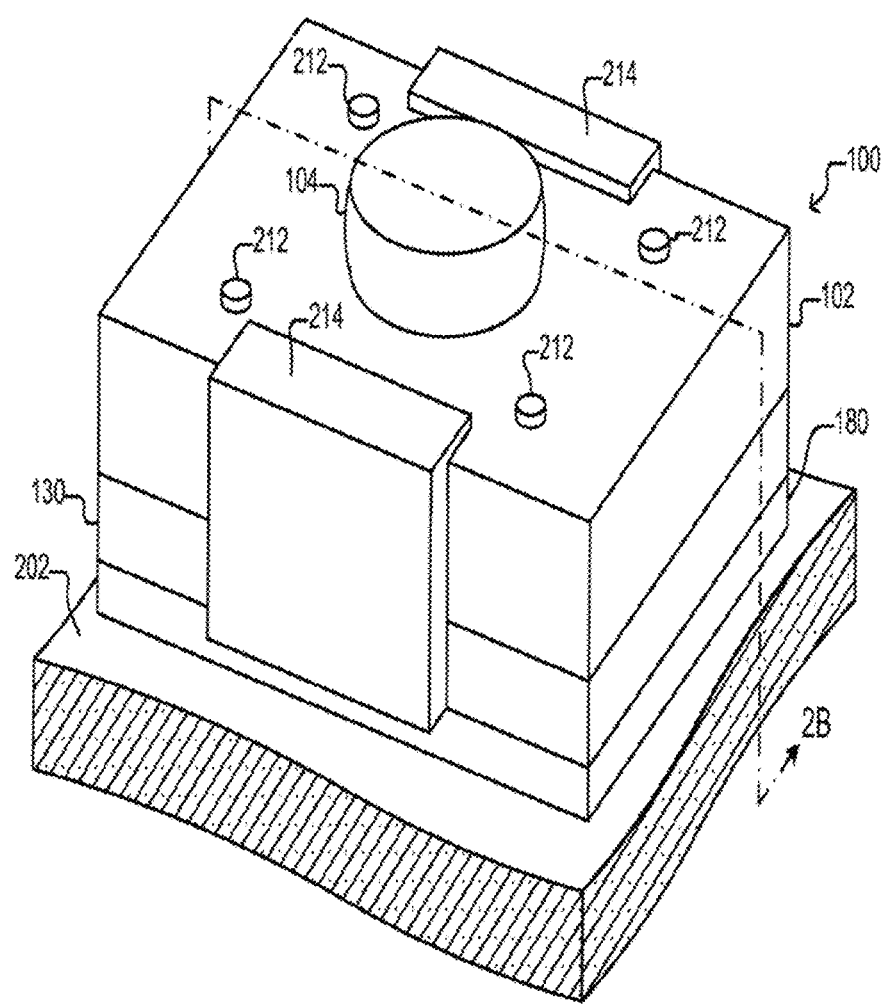
FIG. 2A is a perspective view of the test socket of FIG. 1A fully assembled and attached to a test board according to some embodiments of the invention.
Figure 2B:
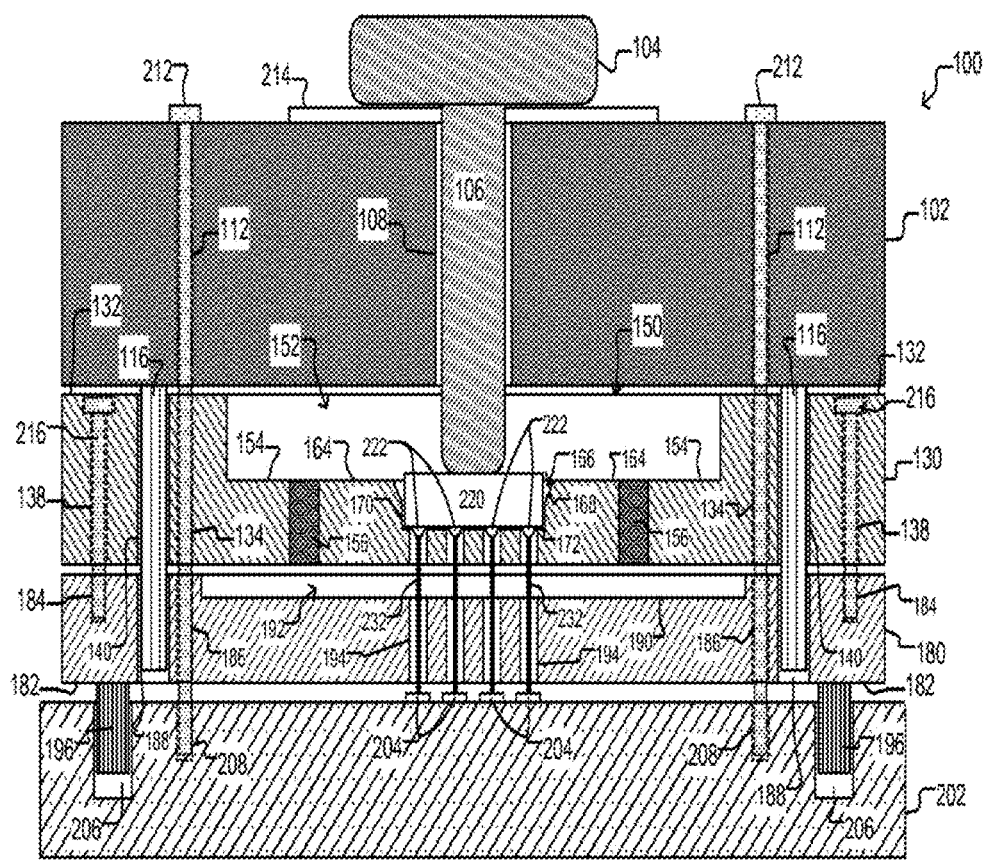
FIG. 2B is a side, cross-sectional view of the test socket and test board of FIG. 2A.

FIGS. 1A and 1B illustrate an example of a test socket 100 according to some embodiments of the invention, and FIGS. 2A and 2B show the test socket 100 fully assembled and attached to an example of a test board 202 for testing a DUT 220. As can be seen, the test socket 100 can comprise a lid 102, a holder 130 for holding a DUT 220 (see FIG. 2B), and a pin assembly 180. The lid 102, holder 130, and pin assembly 180 can be attached to each other to form the socket 100, which can be attached to the test board 202 such that contact pins 232 extend from terminals 204 on the test board 202 through passages (a.k.a. holes) 194 in the pin assembly 180 and passages (a.k.a. holes) 174 in the holder 130 to input and/or output terminals 222 of the DUT 220 (see FIG. 2B). The passages 174 can align the DUT terminals 222 to the contact pins 232. The contact pins 232 can be any elongated electrical connector. Non-limiting examples of contact pins 232 include wires, micro-electromechanical systems (MEMS) probes, pogo pins, or the like.

The DUT terminals 222 can be, for example, balls (e.g., solder balls), pads, studs, or the like. Although not shown, the test board 202 (e.g., its terminals 204 (see FIG. 2B)) can be connected to a test controller (not shown), which can thus provide test signals to and receive response signals from the DUT 220 and thereby test and determine whether the DUT 220 functions as expected.

As shown in FIGS. 1A-2C, the holder 130 can comprise a mounting structure 132 by which the holder 130 can be attached to the pin assembly 180 and/or the lid 102. The holder 130 can also comprise a nested DUT holding structure 150 for holding a DUT 220 (see FIG. 2B).

The mounting structure 132 (hereinafter sometimes also referred to as the holder mount 132) can be, for example, a structural frame that surrounds (e.g., encloses) the nested DUT holding structure 150. The holder mount 132 can have attachment features that facilitate attachment of the holder 130 to the pin assembly 180. For example, the holder mount 132 can comprise countersunk through holes (a.k.a. passages) 138 for bolts 216 (see FIGS. 2A and 2B) that secure the holder 130 to the pin assembly 180. (The countersunk through holes 138 and bolts 216 are shown as dashed lines in FIGS. 1B and 2B because those elements are not visible in the view of those figures.) The holder mount 132 can also have attachment features that facilitate attachment of the holder 130 to the lid 102. For example, the holder mount 132 can include latch receptacles 142 for latches 214 (see FIGS. 2A and 2B) that secure the lid 102 to the holder 130. Alternatively, the holder 130 can be secured to the pin assembly 180 and/or the lid 102 by other means. For example, the holder 130 can alternatively be secured to the pin assembly 180 by latches, clips, clamps, or the like. The holder 130 can similarly be secured to the lid 102 by bolts, clips, clamps, or the like rather than the latches 214 illustrated in FIGS. 2A and 2B.

Figure 7A:
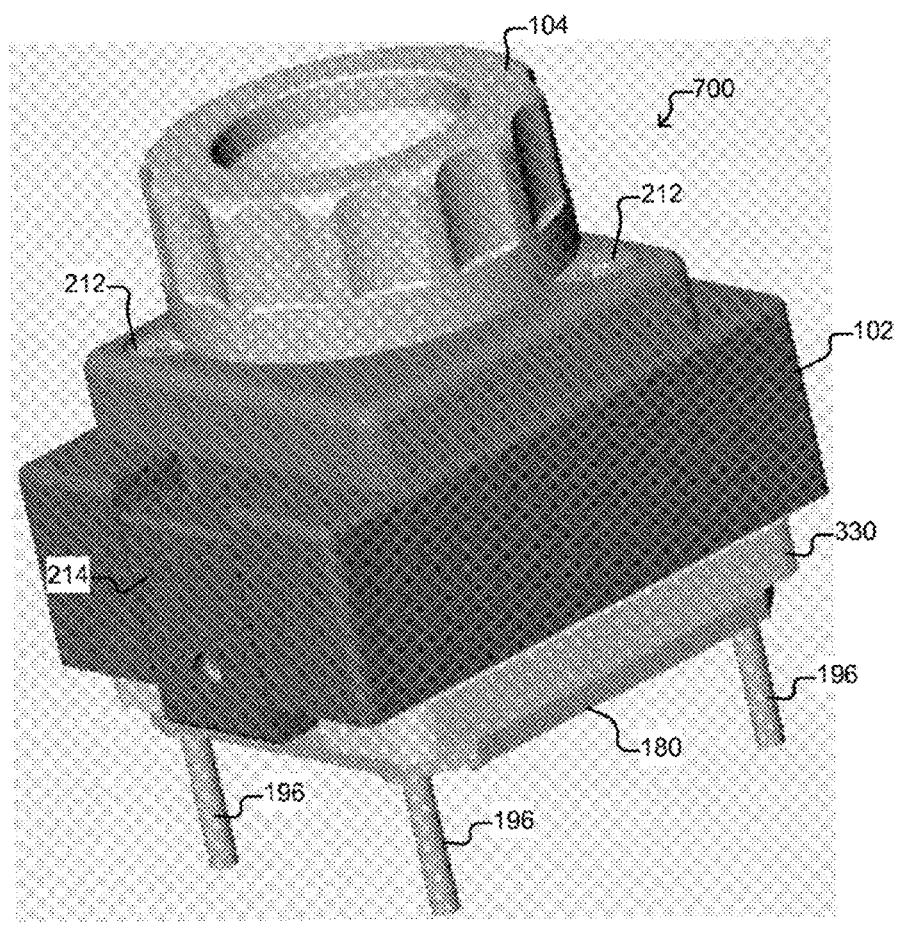
Figure 7B:
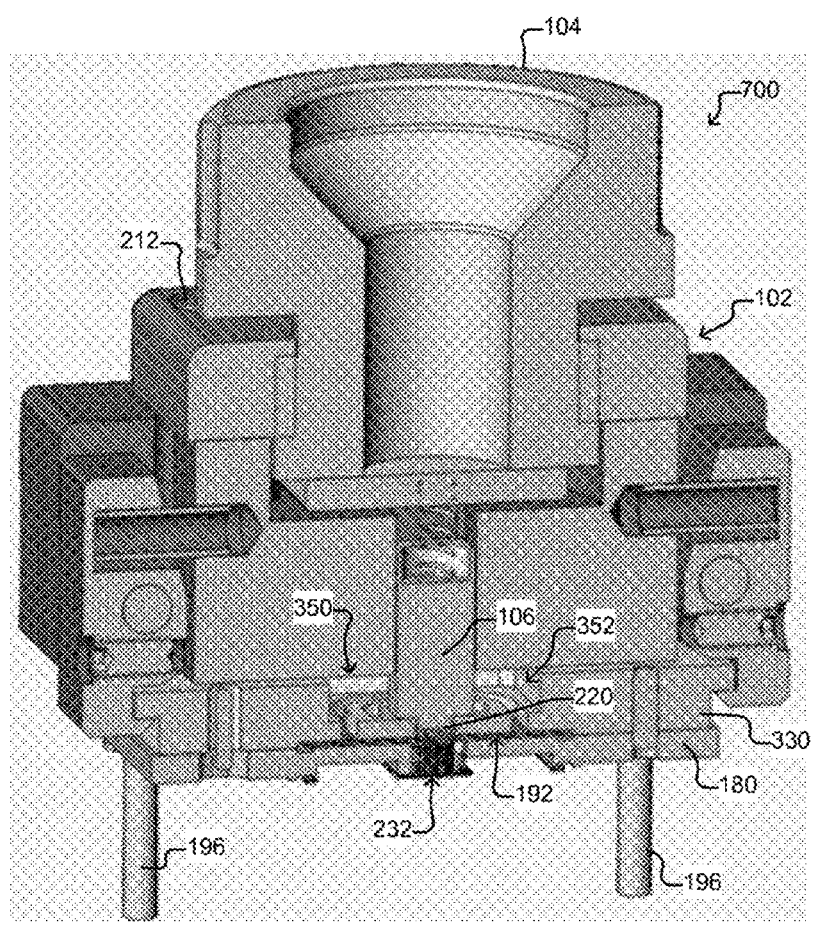
Figure 7D:
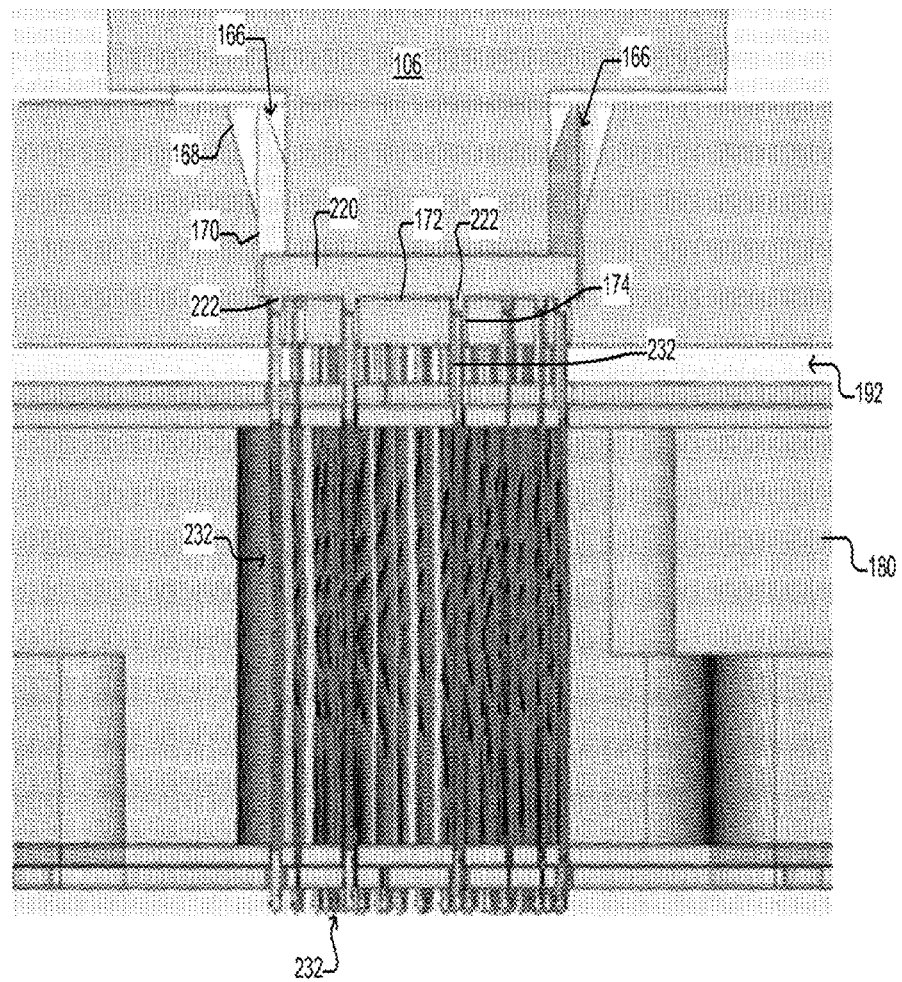

The holder mount 132 can also include other features. For example, as shown in FIGS. 1A-2B, the holder mount 132 can comprise one or more precisely positioned alignment features 140 for facilitating alignment of the holder 130 to the lid 102 and/or the pin assembly 180. In the example illustrated in FIGS. 1A-2B, the lid 102 comprises precisely positioned alignment dowels 116, and the alignment features 140 can, accordingly, be precisely positioned holes as shown. As another example, the alignment features 140 can comprise elastic flexures such as the constraints 206, 706, 1306 illustrated in FIGS. 2, 7, and 13 of U.S. Pat. No. 8,760,187 to Hobbs, which is incorporated herein in its entirety by reference. As yet another example, each alignment feature 140 can comprise slots arranged in a particular pattern such as a radial pattern.

Through holes 134 are another example of additional features that the holder mount 132 can include. As shown in FIGS. 2A and 2B, through holes 134 can accommodate bolts 212 for attaching the assembled socket 100 to the test board 202. (The through holes 134 and bolts 212 are shown as dashed lines in FIGS. 1A and 2B because those elements are not visible in the view of those figures.) Through holes 134 or similar but alterative attachment features can be examples of attachment features by which the holder mount 132 facilitates attachment of the socket 100 to the test board 202.

The example of a nested DUT holding structure 150 illustrated in FIGS. 1A-2B can comprise a fixed frame 154, floating nest 162, and flexure 156 in a cavity 152 in the holder 130. The cavity 152 can allow the fixed frame 154, a floating nest 162, and a flexure 156 to be significantly thinner than (e.g., in some embodiments, less than half as thick as) the holder mount 132.

The fixed frame 154 can comprise a structure that encloses the flexure 156 and the floating nest 162 and can be immovably connected to the holder mount 132. That is, the fixed frame 154 can be connected to the holder mount 132 such that no substantial movement of the fixed frame 154 relative to the holder mount 132 can occur.

In some embodiments, the fixed frame 154 and the holder mount 132 can be portions of the same unitary piece of material (which can be a composite material). For example, the unitary piece of material can comprise a substantially rigid material, which can be electrically insulating. Examples of such materials include a ceramic material, a plastic material, or a plastic material blended with fillers such as ceramic fillers. Ceramic filled polyetheretherketone ("PEEK") compounds such as CeramaPEEK® NC20 marketed by Professional Plastics, Inc. are non-limiting examples of suitable materials. Other examples of suitable materials include nylon, a polyoxymethylene based material commonly referred to as acetal including copolymer and homopolymer (e.g., Delrin®) versions, a polyamide-imide based material such as Torlon® marketed by Solvay, or the like. In still other examples, the unitary piece of material of the fixed frame 154 and the holder mount 132 can comprise a metal base coated with an organic or inorganic electrically insulating film such as a polyimide, aluminum oxide, a parylene, or the like. In such embodiments, the inner sidewalls of the passages 174 can also be coated with the insulating film to prevent the metal base from electrically shorting the contact pins 232. Regardless, the fixed frame 154 and the holder mount 132 can alternatively be distinct structures sufficiently fastened together (e.g., by bolts, nuts, screws, clamps, latches, adhesives, or the like (not shown)) to preclude substantial movement of the fixed frame 154 relative to the holder mount 132.

The floating nest 162 can comprise an outer structure 164, which can surround a seat cavity 166 as illustrated in FIGS. 1A-2B. As illustrated in FIGS. 1B and 2B, the seat cavity 166 can comprise a DUT seat 172 on which the DUT 220 can be disposed. The DUT seat 172 can comprise a plurality of through passages (a.k.a. holes) 174, which can be disposed in a pattern that corresponds to the contact pins 232 extending from the terminals 204 (see FIG. 2B) of the test board 202. As shown, each contact pin 232 can be an elongated, compliant conductive contact structure, and in some embodiments, the contact pins 232 are electrically conductive. While the socket 100 is attached to the test board 202, the contact pins 232 can thus extend into the through passages 174 as illustrated in FIG. 2B. The pattern of the through passages 174 can also correspond to the DUT terminals 222, and the through passages 174 can be sized to receive the DUT terminals 222. While a DUT 220 is disposed on the DUT seat 172, the DUT terminals 222 can thus extend into the through passages 174 and contact the contact pins 232 as illustrated in FIG. 2B.

The seat cavity 166 can be sized and shaped to receive and hold the DUT 220 in an orientation in which each of the DUT terminals 222 contacts and thus makes an electrical connection with a particular corresponding one of the contact pins 232. For example, the seat cavity 166 can comprise tapered and then straight (e.g., vertical) sidewalls 168, 170 to guide the DUT 220 onto the DUT seat 172 such that the DUT terminals 222 enter into the through passages 174 as illustrated in FIGS. 1A, 1B, and 2B. In such a configuration, taped sidewalls 168 can taper from a larger upper opening (as oriented in FIGS. 1B and 2B) of the seat cavity 166 to a smaller lower, intermediate opening.

The flexure 156 can be disposed between the floating nest 162 and the fixed frame 154 and can thus moveably connect the floating nest 162 to the fixed frame 154. The flexure 156 can thus connect the floating nest 162 to the fixed frame 154 while allowing relative movement of the floating nest 162 with respect to the fixed frame 154.

In the embodiment illustrated in FIGS. 1A-2C, the flexure 156 is disposed laterally of both the floating nest 162 (and thus the DUT seat 172 and the DUT 220 while the DUT 220 is disposed on the DUT seat 172) and the fixed frame 154, which is illustrated disposed laterally of the holder mount 132. In contrast, the DUT 220 is shown disposed directly above the DUT seat 172, and the contact pins 232 are shown directly below the DUT seat 172 (and thus the DUT 220 while the DUT 220 is disposed on the DUT seat 172). The flexure 156 allows the floating nest 162 to readily move relative to the fixed frame 154 at least upward in the direction of the DUT 220 and/or downward in the direction of the contact pins 232. Put another way, the flexure 156 can connect the floating nest 162 to the fixed frame 154 in a plane that is substantially parallel to the DUT seat 172 and/or a plane of the DUT terminals 222 while the DUT 220 is disposed on the DUT seat 172, but the flexure 156 allows the floating nest 162 to readily move relative to the fixed frame 154 at least in directions that are substantially perpendicular to the DUT seat 172 and/or the plane of the DUT terminals 222.

Examples of the flexure 156 include an intermediate region or regions of the holding structure 150 between through slots like those illustrated in FIGS. 3A-4C, which are discussed below. Other examples of the flexure 156 include compliant connectors (not shown) connecting the floating nest 162 to the fixed frame 154, where the connectors are springs (e.g., leaf springs) or comprise a flexible or compliant material such as rubber, an elastomer, or the like.

As shown in FIGS. 1A, 1B, and 2B, the pin assembly 180 can comprise an outer frame 182 by which the pin assembly 180 can be attached to the holder 130. The pin assembly 180 can also comprise an inner region 190, which can be defined by a space (e.g., a cavity) 192 in the pin assembly 180. The space 192 can, for example, provide a space in which the floating nest 162 of the holder 130 can move towards the pin assembly 180.

The outer frame 182 can be, for example, a structural frame that surrounds (e.g., encloses) the inner region 190. In some embodiments, the outer frame 182 can be similar to the holder mount 132 of the holder 130. For example, the outer frame 182 can have attachment features that facilitate attachment of the pin assembly 180 to the holder 130. For example, the outer frame 182 can comprise holes (a.k.a. passages) 184 for bolts 216 (see FIG. 2B) that secure the holder 130 to the pin assembly 180. The holes 184 can thus correspond to and align with the countersunk holes 138 in the holder mount 132 of the holder 130. Although not shown, in some embodiments, the outer frame 182 of the pin assembly 180 can also include features that facilitate attachment of the pin assembly 180 to the lid 102.

Like the holder mount 132, the outer frame 182 of the pin assembly 180 can include other features. For example, as shown in FIGS. 1A, 1B, and 2B, the outer frame 182 can comprise one or more alignment features 188 for facilitating alignment of the pin assembly 180 to the holder 130 and/or the lid 102. In the example illustrated in FIGS. 1A-2B, the alignment features 188 can be configured the same as or similar to the alignment features 140 in the holder mount 132.

Through holes 186 are another example of additional features of the outer frame 182 of the pin assembly 180. Through holes 186 can accommodate bolts 212 for attaching the assembled socket 100 to the test board 202. Through holes 186 can thus be examples of attachment features that facilitate attachment of the test socket 100 to the test board 202.

Alignment features 196 are yet another example of additional features of the outer frame 182. As will be discussed, the alignment features 196 can be dowels that extend from the outer frame 182 and mate with corresponding alignment features (e.g., holes 206 (see FIG. 2B)) of the test board 202 to align the assembled socket 100 with the test board 202.

The inner region 190 can comprise through passages (a.k.a. holes) 194, which can be the same as or similar to the through passages 174 in the DUT seat 172 as discussed above. For example, the through passages 194 in the inner region 190 can be sized and disposed in a pattern to correspond to the contact pins 232 (see FIG. 2B). While the socket 100 is attached to the test board 202, the contact pins 232 can extend from the terminals 204 of the test board 202 through the through passages 194 in the inner region 190 of the pin assembly 180 and into the through passages 174 in the DUT seat 172 of the holder 130 as discussed above.

As shown in FIGS. 2A and 2B, the lid 102 can be disposed on the holder mount 132 of the holder 130 and thus cover the cavity 152 and the nested DUT holding structure 150 of the holder 130. The foregoing can be referred to as a "closed" position of the lid 102. The lid 102 can be secured to the holder 130 in the closed position by latches 214 and/or other attaching means (not shown) such as bolts, screws, clamps, or the like. In contrast, when the lid 102 is not attached to the holder mount 132, the lid 102 can be removed, exposing the nested DUT holding structure 150, allowing a DUT 220 to be placed onto or removed from the DUT seat 172. Any such position of lid 102 can be deemed an "open" position of the lid 102. Needless to say, the lid 102 can be moveable between the closed position and the open position. As shown, the lid 114 can include attachment features such as latch receptacles 114 by which latches 214 (see FIGS. 2A and 2B) can secure the lid 102 to the holder 130.

Figure 2C:
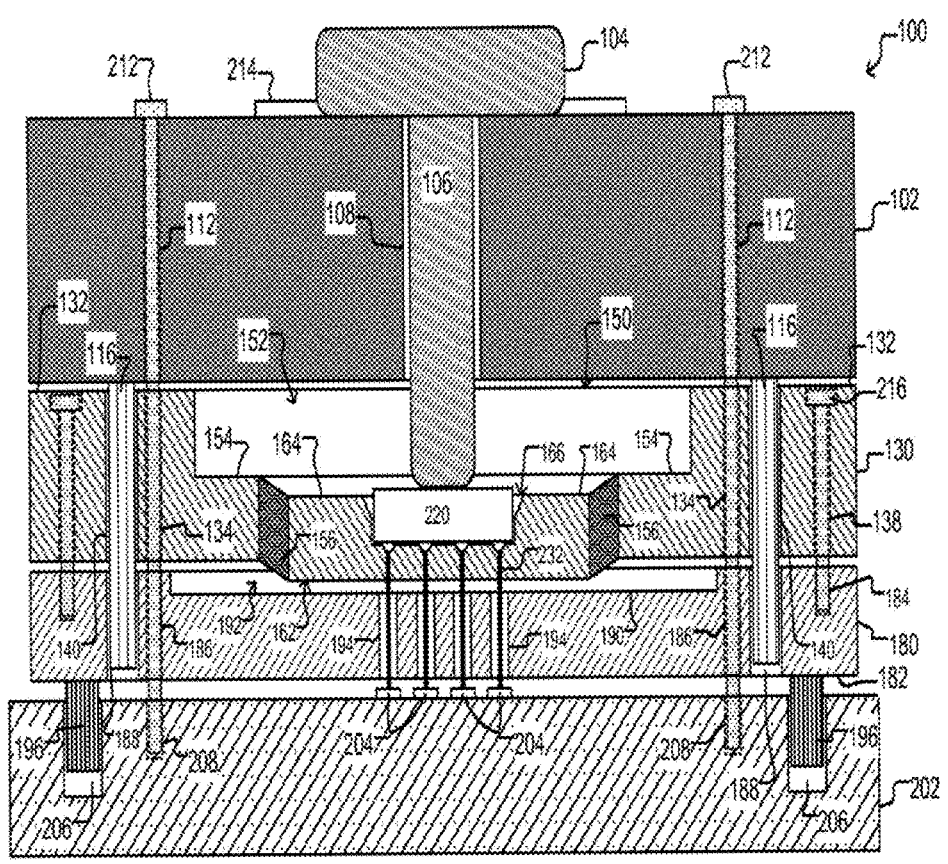
FIG. 2C shows the view of FIG. 2B with the DUT in compression.

As shown in FIGS. 1A-2C, the lid 102 can include a pusher 104 having a plunger 106 that passes through a passage 108 in the lid 102 into the cavity 152 of the holder 130. The pusher 104 can be configured selectively to advance the plunger 106 away from the lid 102 and towards the holder 130 and to retract the plunger 106 away from the holder 130 and towards the lid 102. Thus, while the lid 102 is in the closed position, the pusher 104 can be adjusted selectively to extend the plunger 106 towards the DUT 220 (closing a gap between the plunger 106 and the lid 102) and thus push the DUT 220 firmly against the DUT seat 172, which can cause the floating nest 162 to move downwards towards the contact pins 232 (e.g., as illustrated in FIG. 2C) ensuring low impedance electrical connections between the DUT terminals 222 and the contact pins 232. Also while the lid 102 is in the closed position, the pusher 104 can be adjusted selectively to retract the plunger 106 away from the DUT 220.

As noted above, the lid 102 can comprise alignment features 116 configured to facilitate precise alignment of the lid 102 to the holder 130 and/or the pin assembly 180. In FIGS. 1A-2B, the alignment features 116 are illustrated in the form of dowels 116 configured to mate with corresponding alignment features 140 in the holder mount 132 and/or alignment features 188 in the outer frame 182 of the pin assembly 180. The lid 102 can also include features configured to secure the socket 100 to the test board 202. In the example illustrated in FIGS. 1A-2B, the lid 102 comprises through holes (a.k.a. passages) 112 that correspond to similar through holes 134 and 186 in the holder 130 and pin assembly 180 and attachment holes 208 in the test board 202. In the foregoing example, a fully assembled socket 100 can be attached to the test board 202 by bolts 212 that pass through holes 112, 134, and 186 and are secured to (e.g., by threading into) holes 208 as shown. The socket 100 can be deemed fully assembled when the lid 102, holder 130, and pin assembly 180 are attached one to another in the foregoing manner or any alternative manner mentioned herein.

As mentioned, corresponding alignment features 116, 140, 188 of, respectively, the lid 102, holder 130, and pin assembly 180 can precisely align the lid 102, holder 130, and pin assembly 180 to each other while the lid 102, holder 130, and pin assembly 180 are attached to each other to form a fully assembled socket 100. In addition, corresponding alignment features 196, 206 of the pin assembly 180 and, respectively, the pin assembly 180 and the test board 202 can precisely align the fully assembled socket 100 to the test board 202.

Figure 3A:
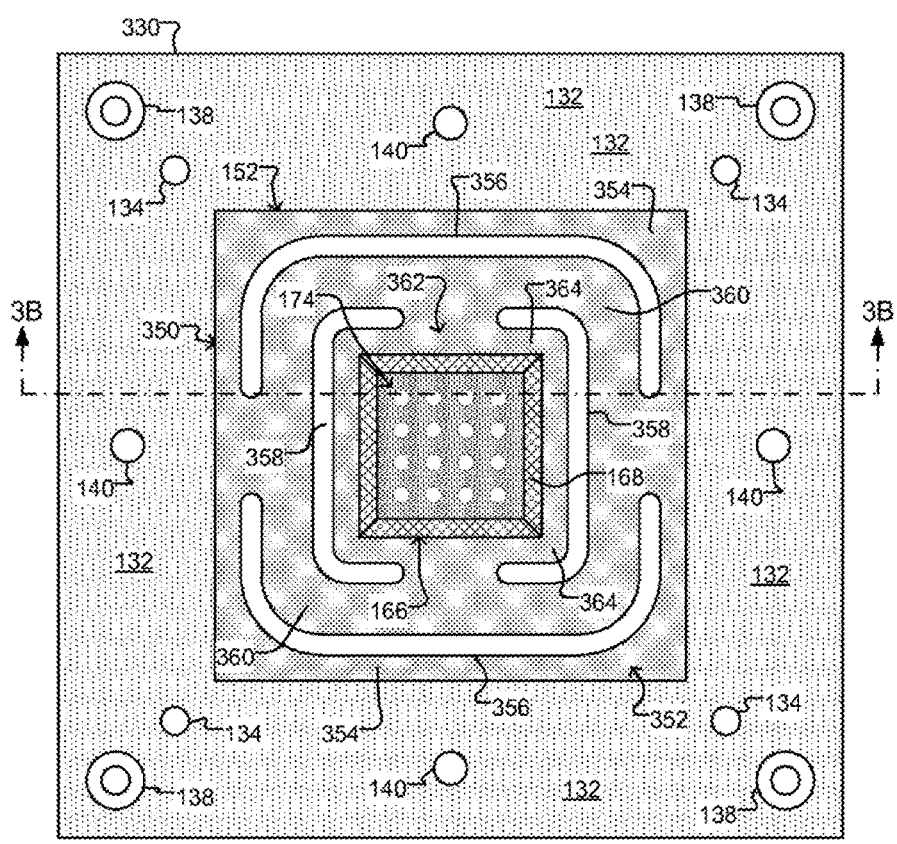

As mentioned above, the flexure 156 of the holder 130 can be implemented in any of a variety of ways. FIGS. 3A and 3B illustrate a non-limiting example of one way of implementing the flexure 156. FIGS. 3A and 3B show a holder 330 that comprises a holder mount 132 and a nested DUT holding structure 350 disposed in a cavity 152. The holder 330 can be an example configuration of the holder 130 of FIGS. 1A-2B and can thus replace the holder 130 in any of FIGS. 1A-2B.

The holder mount 132 and cavity 152 can be the same as like named and number elements of the holder 130 in FIGS. 1A-2B. The nested DUT holding structure 350, however, can comprise multiple regions 354, 360, 364 (three are shown but there can be more or fewer) separated by a plurality of through slots 356, 358 (four are shown but there can be more or fewer). The through slots 356, 358 can be elongated slots that extend through a base 352 of the nested holding structure 350.

Figure 4B:
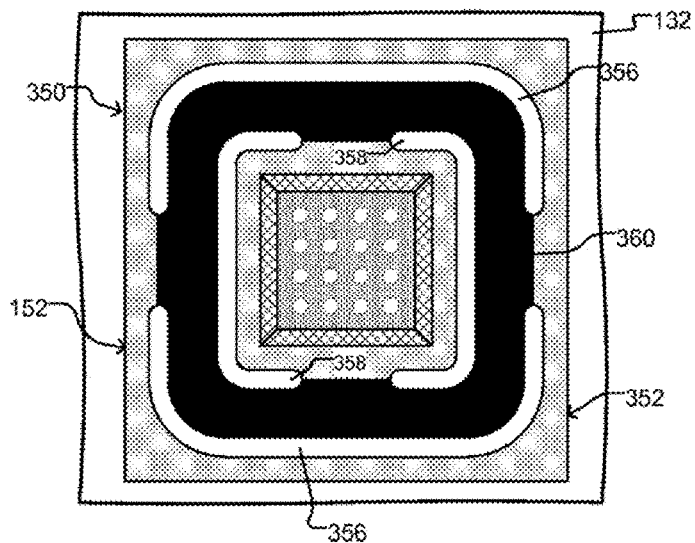
Figure 4C:
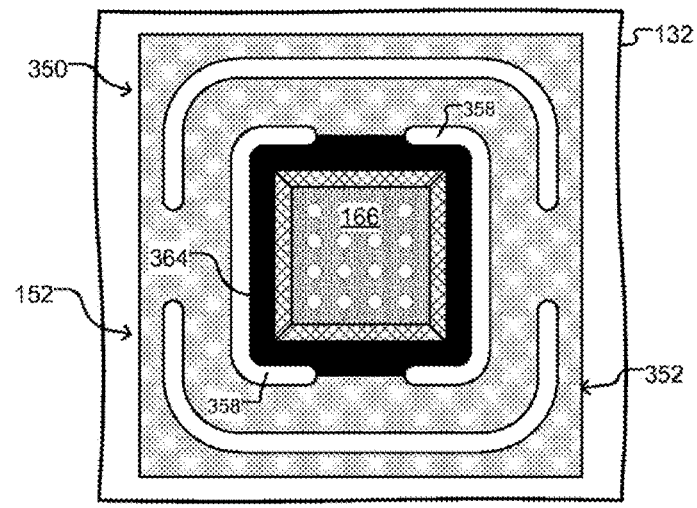

The example of a nested DUT holder structure 350 shown in FIGS. 3A and 3B is illustrated as having an outer set of through slots 356 and an inner set of through slots 358, which define outer 354, intermediate 360, and inner 364 regions of the base 352. As shown in FIG. 4A, the outer region 354 (which is highlighted in black in FIG. 4A) is the region of the base 352 between the outer slots 356 and the holder mount 132. As can be seen in FIG. 4B, the intermediate region 360 (which is highlighted in black in FIG. 4B) is the region of the base 352 between the inner slots 358 and the outer slots 356. FIG. 4C shows the inner region 364 (which is highlighted in black in FIG. 4C) being the region of the base 352 between the seat cavity 166 and the inner slots 358.

The outer slots 356 can allow the intermediate region 360 to move up and down (in the orientation shown in FIG. 3B) with respect to the outer region 354, and the inner slots 358 can allow the inner region 364 and thus the seat cavity 166 to move up and down (in the orientation shown in FIG. 3B) with respect to the intermediate region 360. The combination of the slots 356, 358 and intermediate and inner regions 360, 364 thus allow the seat cavity 166 to move up and down (in the orientation shown in FIG. 3B) with respect to the outer region 354. The outer region 354 can thus be an example of the fixed frame 154 in FIGS. 1A-2B. Likewise, the inner region 364 can be an example of the outer structure 164 in FIGS. 1A-2B, and the combination of the outer slots 356, intermediate region 360, and inner slots 358 can be an example of the flexure 156 in FIGS. 1A-2B. The intermediate region 360 can be an example of flexure elements, and the flexure 156 can be said to comprise such flexure elements. The inner region 364 and seat cavity 166 can thus be an example of the floating nest 162 of FIGS. 1A-2B.

In the example illustrated in FIGS. 3A-4C, the inner slots 358 can comprise pair of slots disposed to partially surround the seat cavity 166, where each slot in the pair can be a mirror image of the other and each slot in the pair can comprise an elongated portion that is substantially parallel to a corresponding elongated portion of the other slot in the pair. The outer slots 356 similarly can comprise a pair of slots disposed to partially surround the inner slots 358, where each slot in the pair of outer slots 356 can be a mirror image of the other and each slot in the pair of outer slots 356 also can comprises an elongated portion that is substantially parallel to a corresponding elongated portion of the other slot in the pair. As shown, the inner slots can be an example of a first set of slots disposed in greater proximity to the floating nest comprising the inner region 364 and the seat cavity 166 than the outer region 354, and the outer slots can be an example of a second set of slots disposed in greater proximity to the outer region 354 than the foregoing floating nest.

The foregoing—which can result in the inner region 364, inner slots 358, intermediate region 360, outer slots 356, and outer region 354 concentrically surrounding the seat cavity 166 as shown in FIGS. 3A-4C—is but an example. There can be a different number of slots 356, 358, which can be have different shapes and be disposed in different patterns to define different regions than the outer 354, intermediate 360, and inner 364 regions illustrated in FIGS. 3A-4C.

As was noted above, the holder 130 and thus also holder 330 can consist entirely or essentially of only a single, unitary piece of material or materials such as discussed above. The holder 330 can thus be made by starting with a block of such a material (e.g., an electrically insulating material including any of the examples of materials identified above), and machining into the block all of the passages, holes, cavities, etc. of the holder 330 illustrated in FIGS. 3A and 3B. Thus, for example, the alignment features (e.g., 140), slots (e.g., 356, 358), and seat cavity (e.g., 166 including through passages 174) can be formed by machining operations on the same block of material and can be positioned as precisely as the machining equipment allows.

FIG. 5 illustrates an example of a holder 530 with a nested DUT holding structure 550 configured to hold multiple DUTs. As shown, the holder 530 can comprise a holder mount 532 and a multi-DUT holding structure 550 disposed in a cavity 552. The holder mount 532 can be generally the same as or similar to the holder mount 132 of FIGS. 1A-2B and can comprise a variety of holes (not labeled) and/or other features (not shown) that can be generally similar to holes, passages, and/or features of the holder 130 discussed above.

The multi-DUT holding structure 550 can be generally similar to the holding structure 150 of FIGS. 1A-2B or the holding structure 350 of FIGS. 3A-4C but can be configured to hold multiple DUTs 220. As shown, the multi-DUT holding structure 550 can comprise a fixed frame 554, a floating multi-nest structure 562, and a flexure 555 that moveably connects the floating multi-nest structure 562 to the fixed frame 554. The fixed frame 554 can be the same as or similar to the fixed frame 154 in FIGS. 1A-2B or the outer region 354 in FIGS. 3A-4C. Although illustrated as comprising outer through slots 556, an intermediate region 560

(e.g., an example of flexure elements), and inner through 558 slots, which can be generally similar to through slots 356, 358 as discussed above, the flexure 555 can instead be configured in any manner mentioned above with respect to flexure 156. The floating multi-nest structure 562 can be similar to the floating nest 162 or 362 (see FIGS. 1A-4C) except the floating multi-nest structure 562 can comprise multiple seat cavities 566 each of which can be the same as or similar to seat cavity 166 as discussed above. In the example illustrated in FIG. 5, slots 556 can be an example of a first set of through slots disposed in greater proximity to the holder mount 532 than the floating multi-nest structure 562, and slots 558 can be an example of a set of second through slots disposed in greater proximity to the floating multi-nest structure 562 than the holder mount 532.

Figure 6A:
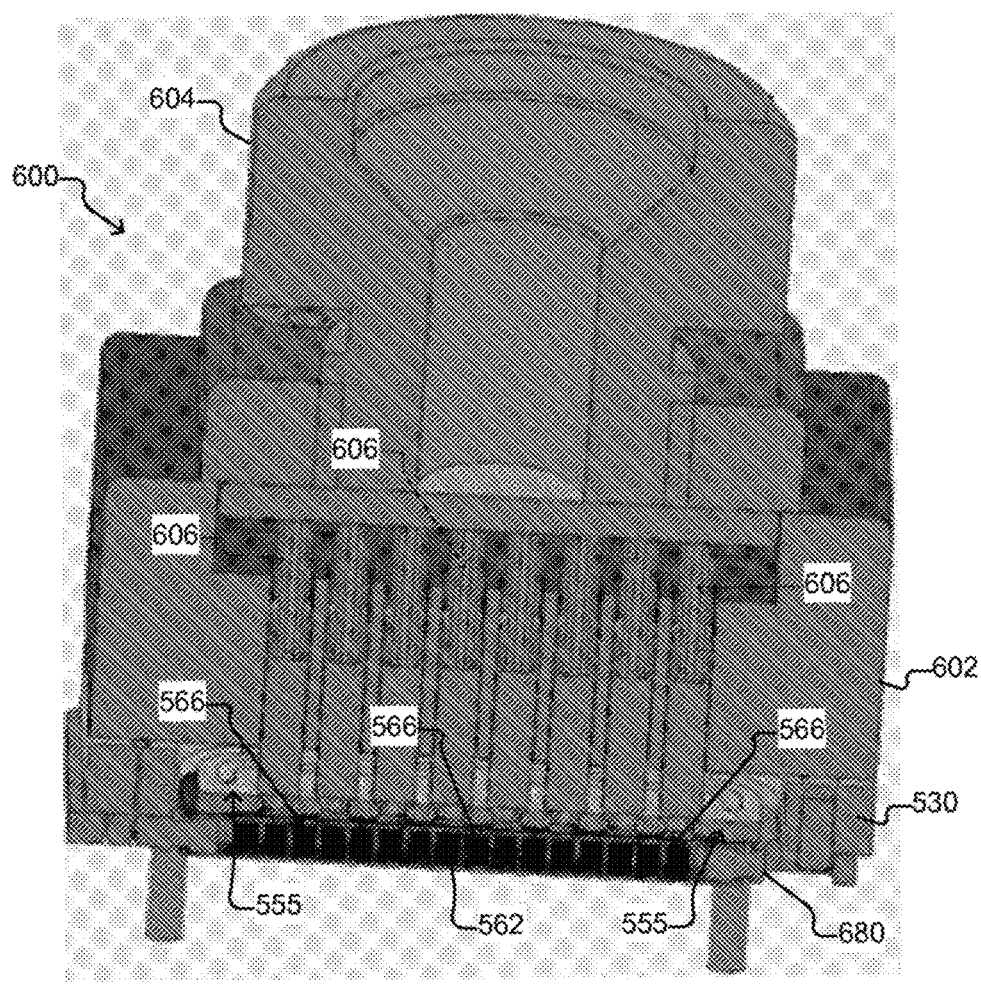

FIGS. 6A and 6B illustrate an example of a multi-DUT socket 600 of which the holder 530 can be a part. As shown, the socket 600 can comprise a lid 602, which can comprise a pusher 604. The lid 602 can be similar to the lid 102 discussed above, and the pusher 604 can likewise be similar to the pusher 104 discussed above except pusher 604 can comprise a plunger 606 for each seat cavity 566 of the floating multi-nest structure 562. The socket 600 can also comprise a pin assembly 680, which can be similar to the pin assembly 180 discussed above. The holder 530 can be attached to the lid 502 and the pin assembly 680 (e.g., in any manner described above by which the holder 130 or 330 can be attached to the lid 102 or the pin assembly 180). As best seen in FIG. 6B, a DUT 220 can be placed into each of the seat cavities 566 and tested simultaneously. Alternatively, a subset of the DUTs 220 in the seat cavities 566 can be tested, and the socket 600 can then be shifted to test another subset of the DUTs 222, which can be repeated until all of the DUTs 220 in the seat cavities 566 have been tested.

FIGS. 7A-7D shown detailed depictions of an exemplary implementation 700 of the socket 100 of FIGS. 1A-2C in which the holder 330 of FIGS. 3A-4C is included in place of holder 130. The elements in FIGS. 7A-7D illustrate non-limiting examples of like numbered elements in FIGS. 1A-4C. The detailed depictions shown in FIGS. 7A-7D are examples only and are not intended to limit the claims to any particular embodiment or configuration of test socket 700 or its constituent elements.

Although specific embodiments and applications of the invention have been described in this specification, these embodiments and applications are examples only, and many variations are possible.

I claim:

1. A test socket configured to hold a device under test (DUT) and be attached to and detached from a test board comprising elongated contacts for contacting terminals of the DUT, the test socket comprising a holder, the holder comprising:
  a mounting structure comprising attachment features configured to facilitate attachment of the socket to and detachment of the socket from the test board;
  a floating nest comprising a seat cavity sized and shaped to receive and hold the DUT with ones of the DUT terminals in contact with corresponding ones of the elongated contacts of the test board while the test socket is attached to the test board; and
  a flexure disposed laterally between the mounting structure and the floating nest and allowing the floating nest to move relative to the mounting structure.

2. The test socket of claim 1, wherein the flexure comprises flexure elements.

3. The test socket of claim 1, wherein the mounting structure, the floating nest, and the flexure are portions of a single, unitary piece of material.

4. The test socket of claim 3, wherein the material is a ceramic filled plastic.

5. The test socket of claim 3, wherein the material comprises a metal base coated with an electrically insulating film.

6. The test socket of claim 3, wherein the material is an electrical insulator.

7. The test socket of claim 3, wherein:
  the seat cavity comprises a seat configured to support the DUT, and
  the seat comprises through holes sized and disposed in a pattern to receive the terminals of the DUT into the through holes at first ends of the through holes.

8. The test socket of claim 7 further comprising a lid that is moveable from an open position in which the DUT can be freely placed into and removed from the seat cavity and a closed position in which the lid is attached to the holder and secures the DUT in the seat cavity against the DUT seat.

9. The test socket of claim 8, wherein the lid comprises an adjustable pusher configured to apply an adjustable level of force pressing the DUT against the DUT seat while the lid is in the closed position.

10. The test socket of claim 8, wherein:
  the lid comprises lid alignment features, and
  the holder comprises holder alignment features configured to mate with the lid alignment features while the lid is in the closed position.

11. The test socket of claim 10, wherein the holder alignment features are integral features formed in the single, unitary piece of material.

12. The test socket of claim 8 further comprising a pin assembly coupled to the holder, wherein the pin assembly comprises through holes corresponding to the through holes in the seat.

13. The test socket of claim 12, wherein the pin assembly comprises pin assembly alignment features configured to mate with the lid alignment features such that, while the lid alignment features are mated with the holder alignment features and the pin assembly alignment features, the through holes in the pin assembly and the through holes in the seat are sufficiently aligned for the contact structures of the test board to extend through the through holes in the pin assembly and into the through holes in the seat where the contact structures contact the terminals of the DUT disposed in the seat cavity.

14. The test socket of claim 7, wherein the through holes in the seat are also sized and disposed in the pattern to receive corresponding ones of the contacts of the test board at second ends of the through holes in the seat opposite to the first ends, while the test socket is attached to the test board.

15. The test socket of claim 14, wherein the seat cavity comprises:
  tapered sidewalls that taper from an upper opening in the seat cavity to an intermediate opening within the seat cavity,
  substantially vertical sidewalls from the intermediate opening in the seat cavity to the DUT seat, and
  wherein the upper opening is larger than the intermediate opening.

16. The test socket of claim 3, wherein the flexure comprises regions of the unitary piece of material between through slots in the holder between the floating nest and the mounting structure.

17. The test socket of claim 16, wherein the through slots comprise:
   a first set of through slots disposed in greater proximity to the floating nest than to the mounting structure, and
   a second set of through slots disposed in greater proximity to the mounting structure than to the floating nest.

18. The test socket of claim 17, wherein the first set of through slots comprises:
   a first one of the through slots comprising an elongated portion that extends along a first side in the seat cavity, and
   a second one of the through slots comprising an elongated portion that extends along a second side in the seat cavity,
   wherein the elongated portions of the first one and the second one of the through slots are substantially parallel.

19. The test socket of claim 18, wherein the second set of through slots comprises:
   a third one of the through slots comprising an elongated portion that extends along a third side in the seat cavity, and
   a fourth one of the through slots comprising an elongated portion that extends along a fourth side in the seat cavity,
   wherein the elongated portions of the third one and the fourth one of the through slots are substantially parallel to each other and substantially perpendicular to the first one of the through slots.

20. The test socket of claim 16, wherein the floating nest comprises a plurality of the DUT cavities each sized and shaped to receive a DUT.

21. The test socket of claim 20, wherein the through slots comprise:
   a first set of through slots disposed in greater proximity to the floating nest than to the mounting structure, and
   a second set of through slots disposed in greater proximity to the mounting structure than to the floating nest.

22. The test socket of claim 21, wherein the first set of through slots comprises:
   a first one of the through slots comprising an elongated portion that extends along first sides of the plurality of the DUT cavities, and
   a second one of the through slots comprising an elongated portion that extends along second sides of the plurality of the DUT cavities,
   wherein the elongated portions of the first one and the second one of the through slots are substantially parallel.

23. The test socket of claim 22, wherein the second set of through slots comprises:
   a third one of the through slots comprising an elongated portion that is substantially perpendicular to the elongated portion of the first one of the through slots, and
   a fourth one of the through slots comprising an elongated portion that is substantially parallel to the elongated portion of the third one of the through slots.

* * * * *